United States Patent
Xu et al.

(10) Patent No.: US 9,150,966 B2
(45) Date of Patent: *Oct. 6, 2015

(54) SOLAR CELL METALLIZATION USING INLINE ELECTROLESS PLATING

(75) Inventors: Baomin Xu, San Jose, CA (US); Karl A. Littau, Palo Alto, CA (US); Scott A. Elrod, La Honda, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1322 days.

This patent is subject to a terminal disclaimer.

(21) Appl. No.: 12/271,408

(22) Filed: Nov. 14, 2008

(65) Prior Publication Data

US 2010/0124619 A1   May 20, 2010

(51) Int. Cl.
*B05D 5/12* (2006.01)
*C25D 5/34* (2006.01)
*H01B 13/00* (2006.01)
*C23C 18/16* (2006.01)
*C23C 18/31* (2006.01)
*H01L 31/0224* (2006.01)

(52) U.S. Cl.
CPC .............. *C23C 18/161* (2013.01); *C23C 18/165* (2013.01); *C23C 18/1632* (2013.01); *C23C 18/1651* (2013.01); *C23C 18/1653* (2013.01); *C23C 18/31* (2013.01); *H01L 31/022425* (2013.01); *Y02E 10/50* (2013.01)

(58) Field of Classification Search
USPC .......................................................... 427/74
See application file for complete search history.

(56) References Cited

U.S. PATENT DOCUMENTS

| | | | |
|---|---|---|---|
| 3,973,994 | A | 8/1976 | Redfield |
| 4,104,091 | A | 8/1978 | Evans, Jr. et al. |
| 4,153,476 | A | 5/1979 | Shelpuk |
| 4,205,216 | A | 5/1980 | Douglas |
| 4,223,202 | A | 9/1980 | Peters et al. |
| 4,235,644 | A | 11/1980 | Needes |

(Continued)

FOREIGN PATENT DOCUMENTS

| | | |
|---|---|---|
| CN | 1346517 A | 4/2002 |
| CN | 1211862 | 7/2005 |

(Continued)

OTHER PUBLICATIONS

Glunz, "High-efficiency crystalline silicon solar cells" 2007.*

(Continued)

*Primary Examiner* — Austin Murata
(74) *Attorney, Agent, or Firm* — Bever, Hoffman & Harms, LLP (57) ABSTRACT

Inline methods for forming a photovoltaic cell electrode structure, wherein the photovoltaic cell includes a semiconductor substrate having a passivation layer thereon, includes providing a plurality of contact openings through the passivation layer to the semiconductor substrate, selectively plating a contact metal into the plurality of contact openings by printing electroless plating solution into the plurality of contact openings to deposit the contact metal, depositing a metal containing material on the deposited contact metal, and firing the deposited contact metal and the deposited metal containing material. The metal containing material may include a paste containing a silver or silver alloy along with a glass frit and is substantially free to completely free of lead. The methods may also use light activation of the passivation layer or use seed layers to assist in the plating.

17 Claims, 8 Drawing Sheets

(56) References Cited

U.S. PATENT DOCUMENTS

| | | |
|---|---|---|
| 4,330,680 A | 5/1982 | Goetzberger |
| 4,355,196 A | 10/1982 | Chai |
| 4,479,027 A | 10/1984 | Todorof |
| 4,533,814 A | 8/1985 | Ward |
| 4,540,843 A | 9/1985 | Gochermann et al. |
| 4,589,191 A | 5/1986 | Green et al. |
| 4,602,120 A | 7/1986 | Wakefield et al. |
| 4,609,037 A | 9/1986 | Wheeler et al. |
| 4,640,001 A | 2/1987 | Koiwai et al. |
| 4,650,294 A | 3/1987 | Nanno et al. |
| 4,664,945 A | 5/1987 | Maeda et al. |
| 4,796,038 A | 1/1989 | Allen et al. |
| 4,826,777 A | 5/1989 | Ondris |
| 4,896,015 A | 1/1990 | Taboada et al. |
| 4,933,623 A | 6/1990 | Fox |
| 4,996,405 A | 2/1991 | Poumey et al. |
| 5,011,565 A * | 4/1991 | Dube et al. ............... 438/98 |
| 5,029,955 A | 7/1991 | Chu |
| 5,075,281 A | 12/1991 | Testardi |
| 5,151,377 A | 9/1992 | Hanoka et al. |
| 5,213,628 A | 5/1993 | Noguchi et al. |
| 5,296,671 A | 3/1994 | Torii et al. |
| 5,356,488 A | 10/1994 | Hezel |
| 5,449,413 A | 9/1995 | Beauchamp et al. |
| 5,468,652 A | 11/1995 | Gee |
| 5,530,418 A | 6/1996 | Hsu et al. |
| 5,538,563 A | 7/1996 | Finkl |
| 5,543,333 A | 8/1996 | Holdermann |
| 5,569,399 A | 10/1996 | Penney et al. |
| 5,665,175 A | 9/1997 | Safir |
| 5,751,436 A | 5/1998 | Kwon et al. |
| 5,753,304 A * | 5/1998 | Tung ............... 427/304 |
| 5,863,338 A | 1/1999 | Yamada et al. |
| 5,916,461 A | 6/1999 | Costin et al. |
| 5,929,530 A | 7/1999 | Stone |
| 5,981,902 A | 11/1999 | Arita et al. |
| 5,990,413 A | 11/1999 | Ortabasi |
| 6,032,997 A | 3/2000 | Elliott et al. |
| 6,072,157 A | 6/2000 | Klebanoff et al. |
| 6,164,633 A | 12/2000 | Mulligan et al. |
| 6,180,869 B1 | 1/2001 | Meier et al. |
| 6,183,186 B1 | 2/2001 | Howells et al. |
| 6,185,030 B1 | 2/2001 | Overbeck et al. |
| 6,194,032 B1 | 2/2001 | Svedberg et al. |
| 6,203,621 B1 | 3/2001 | Tran et al. |
| 6,232,217 B1 | 5/2001 | Ang et al. |
| 6,291,763 B1 | 9/2001 | Nakamura |
| 6,310,281 B1 | 10/2001 | Wendt et al. |
| 6,323,415 B1 | 11/2001 | Uematsu et al. |
| RE37,512 E | 1/2002 | Szlufcik et al. |
| 6,351,098 B1 | 2/2002 | Kaneko |
| 6,354,791 B1 | 3/2002 | Wytman et al. |
| 6,410,843 B1 | 6/2002 | Kishi et al. |
| 6,413,113 B2 | 7/2002 | Uher et al. |
| 6,429,037 B1 | 8/2002 | Wenham et al. |
| 6,459,418 B1 | 10/2002 | Comiskey et al. |
| 6,555,739 B2 | 4/2003 | Kawam |
| 6,628,446 B1 | 9/2003 | Shahar et al. |
| 6,667,434 B2 | 12/2003 | Morizane et al. |
| 6,924,493 B1 | 8/2005 | Leung |
| 6,979,798 B2 | 12/2005 | Gu et al. |
| 7,002,675 B2 | 2/2006 | MacGibbon et al. |
| 7,129,592 B1 | 10/2006 | Yetter |
| 7,388,147 B2 | 6/2008 | Mulligan et al. |
| 7,394,016 B2 | 7/2008 | Gronet |
| 2001/0008230 A1 | 7/2001 | Keicher et al. |
| 2001/0050404 A1 | 12/2001 | Saito et al. |
| 2002/0016016 A1* | 2/2002 | Tsuzuki et al. ............... 438/57 |
| 2002/0060208 A1 | 5/2002 | Liu et al. |
| 2002/0079445 A1 | 6/2002 | Hantschel et al. |
| 2002/0127953 A1 | 9/2002 | Doan et al. |
| 2002/0154396 A1 | 10/2002 | Overbeck |
| 2003/0095175 A1 | 5/2003 | Agorio |
| 2003/0099022 A1 | 5/2003 | Karin et al. |
| 2003/0129810 A1* | 7/2003 | Barth et al. ............... 438/462 |
| 2003/0132121 A1* | 7/2003 | Breen et al. ............... 205/231 |
| 2003/0150109 A1* | 8/2003 | Magoi ............... 29/846 |
| 2003/0213429 A1 | 11/2003 | Kreuzer |
| 2003/0235983 A1* | 12/2003 | Li et al. ............... 438/678 |
| 2004/0012676 A1 | 1/2004 | Weiner |
| 2004/0048001 A1 | 3/2004 | Kiguchi et al. |
| 2004/0200520 A1 | 10/2004 | Mulligan et al. |
| 2004/0229457 A1* | 11/2004 | Chan et al. ............... 438/643 |
| 2005/0000566 A1 | 1/2005 | Posthuma et al. |
| 2005/0022862 A1 | 2/2005 | Cudzinovic et al. |
| 2005/0133084 A1 | 6/2005 | Joge et al. |
| 2005/0142345 A1* | 6/2005 | Jayaraman ............... 428/216 |
| 2005/0176270 A1* | 8/2005 | Luch ............... 439/67 |
| 2005/0196969 A1* | 9/2005 | Gunner et al. ............... 438/725 |
| 2005/0212139 A1 | 9/2005 | Leinikka et al. |
| 2005/0221613 A1 | 10/2005 | Ozaki et al. |
| 2005/0253308 A1 | 11/2005 | Sherwood |
| 2006/0019076 A1* | 1/2006 | Kim et al. ............... 428/209 |
| 2006/0046269 A1 | 3/2006 | Thompson et al. |
| 2006/0076105 A1 | 4/2006 | Furui et al. |
| 2006/0102228 A1 | 5/2006 | Sridharam et al. |
| 2006/0130891 A1 | 6/2006 | Carlson |
| 2006/0251796 A1 | 11/2006 | Fellingham |
| 2006/0266235 A1 | 11/2006 | Sandhu et al. |
| 2007/0001152 A1* | 1/2007 | Yoneima et al. ............... 252/500 |
| 2007/0169806 A1 | 7/2007 | Fork et al. |
| 2007/0259293 A1* | 11/2007 | Shin et al. ............... 430/324 |
| 2008/0116183 A1 | 5/2008 | Curry |
| 2008/0138456 A1 | 6/2008 | Fork et al. |
| 2009/0077255 A1 | 3/2009 | Bachrach et al. ............... 29/890.033 |
| 2009/0188555 A1* | 7/2009 | Castillo et al. ............... 136/256 |
| 2010/0003817 A1* | 1/2010 | Hamm et al. ............... 438/664 |
| 2010/0084009 A1* | 4/2010 | Carlson et al. ............... 136/255 |

FOREIGN PATENT DOCUMENTS

| | | |
|---|---|---|
| DE | 29824597 U1 | 9/2001 |
| EP | 0257157 A | 3/1988 |
| EP | 0851511 A | 7/1998 |
| EP | 1145797 A | 10/2001 |
| EP | 1351318 A | 10/2003 |
| EP | 1763086 A | 3/2007 |
| EP | 1833099 A | 9/2007 |
| EP | 1925964 A1 | 5/2008 |
| GB | 394285 A | 6/1933 |
| JP | 02055689 A | 2/1990 |
| JP | 02-187291 A | 7/1990 |
| JP | 7-326786 A | 12/1995 |
| JP | H09-232606 A | 9/1997 |
| JP | 11-214725 A | 8/1999 |
| JP | 2002111035 A | 4/2002 |
| JP | 2003124483 A | 4/2003 |
| JP | 2004-228450 A | 8/2004 |
| JP | 2004266023 A | 9/2004 |
| JP | 2005-236235 A | 9/2005 |
| JP | 2008066316 A | 3/2008 |
| WO | 91/08503 A | 6/1991 |
| WO | 92/15845 A | 9/1992 |
| WO | 97/21253 A | 6/1997 |
| WO | 97/48519 A | 12/1997 |
| WO | 98/54602 A2 | 12/1998 |
| WO | 02/052250 A | 7/2002 |
| WO | 03/047005 A | 6/2003 |
| WO | 2005076960 A2 | 8/2005 |
| WO | 2006/097303 A1 | 9/2006 |
| WO | 2007/088529 A1 | 8/2007 |

OTHER PUBLICATIONS

Aleman et al., "Characterization of electroless nickel plating on silicon solar cells for the front side metallization," *European Photovoltaic Solar Energy Conference*, 2007.

Cheng et al., "Ink-jet Printing, Self-Assembled Polyelectrolytes, and Electroless Plating: Low Cost Fabrication of Circuits on a Flexible Substrate at Room Temperature," *Macromol. Rapid Commun.*, vol. 26, 2005, pp. 247-264.

U.S. Appl. No. 12/054,034, filed Mar. 24, 2008, in the name of Baomin Xu et al.

(56) References Cited

OTHER PUBLICATIONS

U.S. Appl. No. 11/962,987, filed Dec. 21, 2007, in the name of Baomin Xu et al.
Meier et al., "Solar Cell Contacts," *IEEE*, 1982, pp. 904-910.
Liu et al.; "Self-assembly monolayer of mercaptopropyltrimethoxysilane for electroless deposition of Ag," *Materials Chemistry and Physics*, vol. 82, 2005, pp. 301-305.
Marrian et al.; "Low voltage electron beam lithography in self-assembled ultrathin films with the scanning tunneling microscope," *Appl. Phys. Lett.*, vol. 64, No. 3, Jan. 17, 1994, pp. 390-392.
Cuevas et al. "50 Per Cent More Output Power from an Albedo-Collecting Flat Panel Using Bifacial Solar Cells", Solar Energy, vol. 29, No. 5, pp. 419-420, 1982.
Taguchi et al. "An Approach for the Higher Efficiency in the HIT Cells", IEEE, pp. 866-871, 2005.
Kerschaver et al. "Back-contact Solar Cells: A Review", Progress in Photovoltaics: Research and Applications, 2006, vol. 14, pp. 107-123.
Kranzl et al. "Bifacial Solar Cells on Multi-Crystalline Silicon", 15th International Photovoltaic Science & Engineering Conference, Shanghai, China, 2 pages, 2005.
Mauk et al. "Buried Metal/Dielectric/Semiconducor Reflectors for Light Trapping in Epitaxial Thin-Film Solar Cells", May 1996, IEEE, 25th PVSC, pp. 147-150.
Ruthe et al. "Etching of CuInSe2 Thin Films—Comparison of Femtosecond and Picosecond Laser Ablation", Applied Surface Science, vol. 247, No. 1-4, Jul. 15, 2005, pp. 447-452.
Kenis et al. "Fabrication inside Microchannels Using Fluid Flow", Accounts of Chemical Research, vol. 33, No. 12, 2000, pp. 841-847.
Hitachi: Offering Total Environmental Solutions, Environmental Activities, http://greenweb.hitachi.co.jp/en/sustainable/total-solution.html, 5 pages, 2003.
Neuhaus et al. "Industrial Silicon Wafer Solar Cells", Advances in OptoElectronics, vol. 2007, 2007, 15 pages.
Recart et al. "Large Area Thin BSF Solar Cells With Simultaneously Diffused Boron and Phosphorus Screen Printed Emitters", IEEE, pp. 1213-1216, 2005.
Szlufcik et al. "Low-Cost Industrial Technologies of Crystalline Silicon Solar Cells", Proc. of the IEEE, vol. 85, No. 5, May 1, 1997, pp. 711-730.
Cousins et al. "Manufacturing and Design Issues for Thin Silicon Solar Cells Manufactured on FZ(B), MCZ(B), CZ(Ga) and CZ(B) Wafers", IEEE, pp. 987-990, 2005.
Weber et al. "Modelling of Sliver® Modules Incorporating a Lambertian Rear Reflector", The Australian National University, Canberra ACT 0200, Australia, 4 pages, 2005.
Brogren et al. "Optical properties, durability, and systems aspects of a new aluminum-polymer-laminated steel reflector for solar concentrators", Jan. 2004, Solar Energy Materials and Solar Cells, 82, pp. 387-412.
Nijs et al. "Overview of solar cell technologies and results on high efficiency multicrystalline silicon substrates", Solar Energy Materials and Solar Cells, vol. 48, No. 1-4, Nov. 1, 1997, pp. 199-217.
Sanyo Solar Panels, Sanyo HIT Solar Panel Discount—Solar Electric Supply, Sanyo Solar Modules, http://www.solarelectricsupply.com/Solar_Panels/Sanyo/sanyo.html, 4 pages, 2005.
SunPower Corp. News Release, May 12, 2008, Available URL: http://investors.sunpowercorp.com/releasedetail.cfm?ReleaseID=309613.
Munzer et al. "Thin Monocrystalline Silicon Solar Cells", Oct. 1999, IEEE Transactions on Electron Devices, vol. 46, No. 10, pp. 2055-2061.
Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.

* cited by examiner

SOLAR CELL METALLIZATION USING INLINE ELECTROLESS PLATING

BACKGROUND

Described herein are methods for forming multiple-layer electrode structures for silicon photovoltaic cells, that is, for silicon solar cells. The methods provide an inline process which reduces manufacturing costs. The methods also provide silicon solar cells having low contact resistance with a small contact area, and thus an improved contact resistivity over electrode structures formed with the use of glass frit. The methods also are able to provide reduced environmental concerns compared to the use of lead-based glass frit, a significant advancement as solar energy is a so-called "clean" energy.

Solar cells are typically photovoltaic devices that convert sunlight directly into electricity. Solar cells typically include a silicon semiconductor that absorbs light irradiation, such as sunlight, in a way that creates free electrons, which in turn are caused to flow in the presence of a built-in field to create direct current (hereinafter "DC") power. The DC power generated by several photovoltaic (PV) cells may be collected on a grid associated with the cells. Current from multiple PV cells is then combined by series and parallel combinations into higher currents and voltages. The DC power thus collected may then be sent over wires, often many dozens or even hundreds of wires. The DC power may also be converted to AC power using well-known inverters.

To form metal contacts able to gather and convey the generated power, the solar cell material is metallized. For silicon solar cells, metallization typically comprises forming a grid-like metal contact, for example including fine fingers and larger busbars, on a front surface of the cell and forming a full area metal contact on the back surface of the cell. Conventionally, metallizing silicon solar cells is done by screen printing. Screen printing has been used for decades, and is a robust, simple, rapid, and cost-effective metallization method and can be easily automated for large-scale solar cell manufacturing. In a conventional screen printing approach to the metallization of solar cells, a squeegee presses a paste through a mesh with a pattern that is held over the wafer. A typical paste for solar cell metallization consists of a mixture of silver particles, a lead-based glass frit and an organic vehicle. When the wafer is fired (annealed), the organic vehicle decomposes and the lead-based glass frit softens and then dissolves the surface passivation layer, creating a pathway for the silver to reach the silicon base by forming a multitude of random points under a silver pattern formed by the paste. The surface passivation layer, which may also serve as an anti-reflection coating, is a dielectric layer, such as a silicon nitride layer, and is an essential part of the cell covering the cell except for electrical contact areas. Upper portions of the silver paste densify into one or more films that carries current from the cell. These films form gridlines on the frontside of the wafer. The silver of the paste is also a surface to which tabs connecting adjacent cells may be soldered.

While the use of a lead-based glass frit combined with screen printing has advantages, it also has several drawbacks. First, contact resistivity, or specific contact resistance, is very large, for example, specific contact resistance between the semiconductor emitter layer (sun-exposed surface) and the silver gridline is on the order of about $10^{-3}$ $\Omega \cdot cm^2$. This specific contact resistance between the silicon semiconductor emitter layer and the silver gridline is several orders of magnitude higher than the specific contact resistance that may be reached in semiconductor integrated circuit devices, which is on the order of about $10^{-7}$ $\Omega \cdot cm^2$. The large contact resistivity is the result of a low effective contact area between the silicon semiconductor emitter layer and the silver electrode gridline due to the non-conductive glass frit occupying a considerable portion of the interface. Due to the large specific contact resistance, the emitter layer in a solar cell must be heavily doped and large contact area between the emitter and silver gridline must be used, otherwise the silver of the paste cannot make good electrical contact to the silicon. The heavy doping kills the minority carrier (holes) lifetime in the top portion of the cell and limits the blue response of the cell, and the large contact area generates higher surface recombination rate. As a result, the overall efficiency of the solar cell is reduced.

Another problem with the glass frit approach is a narrow process window. The narrow process window may be a problem because a thermal cycle, that fires the gridline, must burn through the silicon nitride to provide electrical contact between the silicon and the silver without allowing the silver to shunt or otherwise damage the junction. This narrow process window severely limits the process time to the order of about 30 seconds and temperature band to about 10° C. around the peak firing temperature.

Still further, the use of lead-based glass frit, required to dissolve portions of the passivation layer, raises environmental concerns.

Ideally, a metallization technology for silicon solar cells should form the gridline electrodes with low specific contact resistance and thus low contact area, high conductivity, good solderability, and long time stability. Because it is very difficult for a single layer electrode to meet all these requirements, several methods for forming multiple-layer electrode structures have been proposed for silicon solar cells.

U.S. Patent Application Publication No. 2007/0169806, incorporated herein by reference in its entirety, discloses forming multiple-layer gridline front surface electrodes by forming contact openings through the passivation layer using a non-contact patterning apparatus such as a laser-based patterning system. The contact openings may be filled by inkjet printed nanophase metallic inks and covered with silver gridlines. However, several problems associated with using printed nanophase metallic inks for filling the contact openings include quality and availability of the nanophase metallic inks, the wetting behavior and contact characteristic between the nanophase metallic ink and the silicon surface in the contact openings, and the process compatibility of nanophase metallic ink with firing silver gridlines.

U.S. Patent Application Publication No. 2004/0200520 discloses a multiple-layer backside electrode structure that is formed by making contact openings through chemically etching the passivation or anti-reflection coating layer, followed by sputtering or evaporating a three layer-seed metal stack to form the contact with emitter and plating copper and a thin metal capping layer to form gridlines. However, chemically etching the passivation layer involves several extra process steps including applying an etch resist layer, patterning the etching resist layer, and striping off the etching resist layer after patterning the passivation layer.

U.S. Patent Application Publication No. 2005/0022862 discloses screen printing a liquid ink pattern layer devoid of particles onto the silicon oxide passivation layer to form a particle-devoid ink pattern layer as an etching protection mask.

U.S. Pat. No. 6,194,032 discloses a selective substrate metallization method using a plating gel. However the plating gel contains a polymeric thickening agent, rather than a conventional liquid-type electroless plating solution.

There are several disadvantages to using traditional bath electroless plating to metallize solar cells. Traditional electroless plating is a batch process, where articles are removed from the manufacturing line, plated, then returned to the manufacturing line. Solar cell manufacturing, however, prefers to utilize an inline manufacturing process. As such, after loading the articles onto a conveyor belt, it is expected that all the processing steps can be finished by keeping the articles on the conveyor. Therefore, batch processing has been difficult to implement into solar cell manufacturing. Additionally, because electroless plating typically occurs at elevated temperatures, such as about 90° to 100° Celsius, and the plating solution may contain some aggressive compositions of acids and bases, it may destroy the nitride antireflection coating layer, especially on multicrystalline silicon solar cells.

It is still deemed desirable to develop more rapid, cost efficient and/or less complex methods of forming metallization contact structures for solar cells that provide low contact resistance, low contact area, high conductivity, high solderability, and high stability from solar exposure.

SUMMARY

Described herein are inline methods for metallizing a photovoltaic cell electrode structure, wherein the photovoltaic cell comprises a semiconductor substrate having a passivation layer thereon, comprising providing a plurality of contact openings through the passivation layer to the semiconductor substrate, selectively printing electroless plating solution on the plurality of contact openings to deposit the contact metal layer, depositing at least one metal containing layer over the contact metal layer to form metal gridlines, and firing the contact metal and the deposited metal containing material. The method is completed inline, that is, without removing a sample from the manufacturing line for metallizing. In embodiments, the plating solution is deposited into the contact openings using an inkjet printer, while in further embodiments the metal containing material may include a paste containing a silver or silver alloy along with a glass frit and is substantially free to completely free of lead, while in further embodiments, the methods may also use light activation of the passivation layer or use seed layers to assist in the plating.

Also described is a method for forming a photovoltaic cell electrode structure, wherein the photovoltaic cell comprises a semiconductor substrate having a passivation layer thereon, comprising depositing a photographic emulsion layer on a surface of the passivation layer; providing a plurality of contact openings through the photographic emulsion layer and the passivation layer to the semiconductor substrate; developing the emulsion layer at portions on and surrounding one or more of the plurality of contact openings to form an image comprised of silver metal atoms; selectively printing electroless plating solution in the plurality of contact openings to deposit the contact metal; depositing at least one metal containing layer over the deposited contact metal to form metal gridlines; and firing the deposited contact metal and the deposited metal containing material.

Further described is a method for forming a photovoltaic cell electrode structure, wherein the photovoltaic cell comprises a semiconductor substrate having a passivation layer thereon, the method comprising providing a plurality of contact openings through the passivation layer to the semiconductor substrate; selectively printing electroless plating solution into the plurality of contact openings to deposit the contact metal; depositing at least one metal containing layer over the deposited contact metal to form metal gridlines; and firing the deposited contact metal and the deposited metal containing material, wherein the method further comprises one of (a) light activating portions of the surface of the passivation layer surrounding one or more of the plurality of contact openings, wherein the selective printing of the electroless plating solution to deposit the contact metal into the plurality of contact openings also deposits the contact metal onto the light activated portions of the passivation layer, (b) depositing a light sensitive seed layer over the passivation layer prior to forming the plurality of contact openings in the passivation layer, and light activating the seed layer in portions on and surrounding one or more of the plurality of contact openings, wherein the selective printing of the electroless plating solution into the contact openings to deposit the contact metal deposits the contact metal at light activated portions of the seed layer and in the plurality of contact openings, or (e) depositing a self-assembled monolayer material over the passivation layer following forming the plurality of contact openings in the passivation layer at portions on and surrounding one or more of the plurality of contact openings, and wherein the selective printing of the electroless plating solution to deposit the contact metal on the self-assembled monolayer and in the plurality of contact openings.

EMBODIMENTS

The methods disclosed herein provide silicon solar cells with low contact resistivity and low metal contact area. Thereby, the absolute efficiency of the solar cells may be improved by about 1%. This corresponds to a relative efficiency improvement of approximately 7%. This efficiency improvement could yield savings worth approximately $10M per 1100 MW of power used on the solar cell production line.

Described herein are methods for metallizing a photovoltaic cell electrode structure, wherein the photovoltaic cell comprises a semiconductor substrate having a passivation layer thereon, wherein the methods commonly share the steps of providing a plurality of contact openings through the passivation layer to the semiconductor substrate, selectively printing electroless plating solution into the plurality of contact openings to deposit a contact metal layer, and depositing at least one metal containing layer over the contact metal layer to form metal gridlines, and firing the contact metal and the deposited metal containing material. "Over" herein refers to, for example, a layer being formed directly on an underlying layer, or being formed over the layer, for example with other layers intervening therebetween. The at least one metal containing layer may form a metal gridline of the photovoltaic cell, and may be a single layer metal, such as a screen printed silver layer, or a multiple layer metal, such as a first layer of copper and the like with a second layer of silver and the like. One or more conductive buffer layers may also be formed over the deposited contact metal prior to deposit of the at least one metal containing layers.

Thus, described are methods to metallize silicon photovoltaic cells based on writing contact openings through the passivation layer and selective printing of electroless plating solution into and/or around the contact openings to selectively deposit contact metal. In one embodiment, a laser is used to write contact openings in the form of lines, dots and the like, that underlie metal gridlines. Electroless plating solution is then selectively printed into the contact openings, for example by using an inkjet printer to deposit the metal contact layer. If necessary, a radiation heater, such as an infrared heater, may be used to heat the front surface of the sample during the plating process to the temperature range required by the inline electroless plating, such as 50° C. to 100° C., for approximately 1 to 10 minutes, depending on the plating solution used. Alternatively, the plating process may be conducted at room temperature.

Unlike traditional bath plating where the samples are fully submerged into a bath of electroless plating solution, the method disclosed herein will print the plating solution only into the contact openings, and/or the small area around the contact openings. Using a printer to print the plating solution provides great flexibility to adjust the plating solution to improve the metallization process, without changing the characteristics of the front surface passivation layer. For example, to form a good contact through the openings in the passivation layer, it is traditionally required to completely remove the passivation layer and remove less than 100 nm of the emitter layer. Instead, by using the inline printing method, one may also put some passivation layer etching solution into the plating solution, such as HF solution, for etching the silicon nitride passivation layer. After printing the plating solution into the contact openings, the passivation layer etching solution can remove the residual of the passivation layer in the openings, if there is any. Therefore, fully removing the passivation layer is not required during the step where contact openings are made. This can extend the process window to make the contact openings, and therefore the process yield can be improved. One can also add donor doping elements into the plating solution, such as phosphor. During the plating process, the donor doping elements will also be deposited into the contact openings, and then during the firing process, the doping elements will diffuse into the substrate to form a self-doping region near the contact openings. Thus, the shunting of the pn junction can be avoided, and a good ohmic contact with very low contact resistance can be formed even if the emitter layer on the substrate is very shallow and has very high sheet resistance, such as an emitter layer with sheet resistance higher than 100 Ω/square.

A contact metal such as Ni, Co, Ti and the like is selectively deposited by printing the electroless plating solution in the laser drilled contact openings to form a metal/emitter contact. Utilizing this method of printing the electroless plating solution into the contact openings allows the metallization to be completed in-line. Therefore, the samples do not need to be removed from the manufacturing line for plating and then returned to the line to complete the fabrication process. The metallization is therefore completed inline by having the printing device located in the manufacturing line.

Metal gridlines, for example of silver, copper, alloys thereof and the like, may then be formed on or over the thin contact metal layer, for example by screen printing or co-extrusion. As above, the metal gridlines may be formed directly on the contact metal layer, or may be formed on one or more conductive buffer layers that are formed on or over the metal contact layer. The structure is then co-fired to complete the metallization.

The semiconductor substrate may be made of, for example, a semiconductor material, such as silicon and the like.

The passivation layer is comprised of a dielectric material. Suitable dielectric materials for the passivation layer on the semiconductor substrate include, for example, an oxide such as $SiO_2$ or $TiO_2$, or a nitride such as silicon nitride or silicon oxygen nitride, or combinations thereof. In the photovoltaic cell, the passivation layer may act as an antireflection film, particularly if the layer is formed on the front side of the cell, or on the back surface of the solar cell if it is a bifacial cell.

The one or more contact openings may be formed in the passivation layer by a non-contact patterning apparatus, for example by use of a laser. In embodiments, the one or more contact openings may include one or a plurality of holes, one or a plurality of lines, a combination of one or a plurality of holes and one or a plurality of lines, or one more additional shapes or configurations. The diameter of holes may be in a range of, for example, about 1 μm to about 200 μm, such as from about 5 μm to about 100 μm or from about 10 μm to about 50 μm. The holes may have a pitch of, for example, about 0.01 mm to about 2 mm, such as from about 0.1 mm to about 1 mm or from about 0.2 mm to about 0.5 mm. Lines may include grooves or trenches in the passivation layer. The lines may have a width in a range of, for example, about 1 μm to about 200 μm, such as from about 5 μm to about 100 μm or from about 10 μm to about 50 μm.

The one or more contact openings may be formed by the non-contact patterning apparatus through the passivation layer to expose doped portions of the semiconductor substrate and to open the top side of the semiconductor substrate.

In embodiments, the non-contact patterning apparatus may be a laser device capable of generating laser pulses of sufficient energy to ablate (remove) portions of the passivation layer to form the one or more contact openings therein that expose the top side of the semiconductor substrate. Advantages of laser ablation include that there is typically no need for cleaning, rinsing, drying or other processing following laser ablation and prior to metallization. The non-contact patterning apparatus may also be a particle-beam generating apparatus that forms the one or more openings in the passivation layer, such as an ion milling apparatus.

In embodiments, the laser may be a Coherent Inc. model AVIA 266-300 Q-switched Nd-YAG operating at a pulse repetition rate on the order of about 1 KHz to about 100 KHz. The fluence needed to ablate the surface of the passivation layer is on the order of, for example, about 1 Joule/cm$^2$. The pulse length of the laser is on the order of one to tens of nanoseconds. The wavelength may be on the order of about 266 nm. The short pulse and wavelength of such lasers ensure that the energy is deposited near the surface and melting in the semiconductor substrate is minimal. This minimizes any change to the doping profile of diffusion regions of the semiconductor substrate. The energy of a 266 nm photon is about 4.66 electron volts. Although the bandgap of the passivation layer varies over a wide range, this photon energy is comparable to the band gap of silicon nitride in its most transparent forms. These highly energetic photons are absorbed in the surface of the passivation layer and/or in the topmost nanometers of the underlying semiconductor substrate. A lightly doped emitter will have a phosphorous diffusion depth of about 200 nm, a sheet resistance on the order of about 100 ohms, and a non-degenerate level of dopant at the physical surface. The material of the semiconductor substrate may be a good thermal conductor causing rapid quenching of the semiconductor substrate melt formed below the surface of the passivation layer. In embodiments, suitable control of the process conditions allows removal of the passivation layer without significantly altering the thickness or doping profile of the underlying semiconductor substrate.

In embodiments, the laser apparatus includes a femtosecond laser. An advantage of using a femtosecond laser is that the laser energy can be deposited in a timeframe that is faster than the time required for the material to reach thermal equilibrium. Thus, the passivation layer can be ablated with less debris.

In embodiments, other contact or non-contact patterning apparatus or methods can also be employed to form the one or more openings. For example, the one or more openings can be formed by chemical etching through direct printing of an etchant material onto the passivation layer, for example using ink jet printing, screen printing, pad printing or other printing method. Alternatively, the chemical etching may also be performed by direct printing an etching protective mask onto the passivation layer and then putting the substrate into an etching solution. The etching protection mask can also be formed by spin coating, spray coating or evaporating a protection layer followed by patterning the protection layer.

The contact metal filling the contact openings, deposited by the electroless plating solution, is a conductive metal. An electroless plating solution typically contains a solvent, usually water, a compound of a metal to be deposited, a catalytic accelerator and a stabilizer. The conductive contact metal layer may be, for example, a thin metal layer that has a low contact resistance and/or a robust adhesion to the semiconductor substrate or an n$^+$ emitter of the semiconductor substrate. Silicide forming conductive metals, that is, metals that form a silicide with silicon, are desirably used. In embodiments, the conductive contact metal may comprise a conductive metal material such as nickel (Ni), cobalt (Co), titanium (Ti), tantalum (Ta), tungsten (W), molybdenum (Mo), alloys thereof and the like. When Ni is used, it may or may not contain phosphorus.

The electroless plating solution, depositing the contact metal layer, may be deposited into the contact openings by printing. One example of a commercially available electroless plating solution that may be used is Transene Nickelex. Multiple droplets of the electroless plating solution may be deposited in order to form a dense plated metal layer, or increase the contact metal layer thickness. The contact metal may have a thickness ranging from, for example, about 1 nm to about 2,000 nm, such as from about 5 nm to about 1,000 nm or from about 20 nm to about 200 nm.

In plating, including electroless plating, the metal is built up from the molecular level. Traditional bath electroless plating selectively deposits the contact metal into the laser drilled contact openings after submerging an article into a bath of plating solution, the selectivity being natural because the n-type conductive emitter of the semiconductor substrate provides electrons to reduce the metal ions, for example such as Ni$^{2+}$ ions, to metal elements such as Ni, thereby depositing the metal on the emitter and in the contact openings. An unaltered surface of the passivation layer, on the other hand, is insulating, such as with oxide and nitride layers, and thus cannot provide electrons necessary to achieve deposition on the surface of the unaltered passivation layer. The method disclosed herein deposits the electroless plating solution directly into the contact openings by printing, thereby avoiding the need to remove the article from the manufacturing conveyor and submerge the sample into an electroless plating solution, which allows the manufacturing process to be completed inline.

Inline electroless plating is used, wherein the electroless plating solution is deposited selectively using a printer, such as an inkjet printer, rather than the traditional method of submerging the structure into a bath of electroless plating solution. Electroless plating, also known as chemical or auto-catalytic plating, is a non-galvanic type of plating method that involves several simultaneous reactions using an aqueous solution, which occurs without the use of external electrical power, unlike in electroplating. Metal ions are produced, which are reduced as above to be deposited on the surface being electroplated. In the traditional bath electroless plating process, the sample to which the metal is to be plated is placed in the plating solution, and plating is conducted to deposit the metal. Traditionally, selective electroless plating can be realized due to the different physical or chemical properties of the surfaces (for example, a conductive or semiconductive surface vs. an insulating surface), by selectively depositing and activating a seed layer on the surface, or selectively activating the surface using such as a laser exposure. Herein, the sample does not need to be placed into a plating solution, as is needed in the traditional bath electroless plating process. Selective electroless plating can be through printing of electroless plating solution directly into the contact openings. The plating solution is directly deposited into the contact openings by use of a printer, such as an inkjet printer. Multiple droplets of plating solution may be used to form a dense plated metal layer or to increase the contact metal layer thickness.

Typically, electroless plating is processed at an elevated temperature, such as about 50° to about 100° C. The samples can be printed with the electroless plating solution using any suitable ink jet printing device. In one embodiment, the contact openings on the front surface of the samples can be formed by laser ablation, as described above. Then, on the same manufacturing line, such as a transport conveyor, the substrate is transferred to where the electroless plating solution is printed into the openings. The samples are precisely positioned on the transportation conveyor by pre-calibrating and registering the laser ablation apparatus and the printer; therefore, the electroless plating solution can be precisely printed into the contact openings made by the laser ablation. Next, the samples may be transported on the same manufacturing line, to a radiation type heater, such as an infrared heater, to heat at least the top of the samples to the temperature range required, such as from about 50° to 100° C. for the electroless plating. The heating of the samples is performed immediately following the inline printing of electroless plating solution into the contact openings of the sample.

When metals such as nickel, cobalt, titanium, tantalum, tungsten or molybdenum are used as the conductive contact metal, during or after the thermal processing of the structure, a metal silicide layer, such as a nickel silicide layer, may form at the interface between the conductive contact metal and the semiconductor substrate.

Following deposition of the contact metal by printing the electroless plating solution into the contact openings, at least one conductive metal layer for forming the metal gridlines may be formed on or over the contact metal, for example by well known techniques such as screen printing, co-extrusion, extrusion, pad printing, jet printing, dispensing and the like can be used in the inline process. The metal gridlines may be comprised of, for example, silver, tin, copper, alloys thereof and the like. The metal gridlines may comprise single layers, or may comprise multiple layers, such as a layer of copper with a layer of silver thereon. The gridline layer may have a thickness of from, for example, about 1 to about 150 microns or such as from about 5 to about 50 microns.

The metal gridlines may be formed directly on the contact metal layer, or may be formed on one or more conductive buffer layers that are formed on the metal contact layer. Buffer layers may be used to prevent diffusion of the metal of the gridlines into the semiconductor substrate, and they can be selectively formed or deposited on the contact metal layer by the methods such as electroless plating, light induced plating or electroplating described above. The buffer layer(s) may have a conductivity greater than that of the contact metal layer. The buffer layer(s) may be comprised of, for example, tungsten, chromium, titanium, alloys thereof and the like. The buffer layer(s) may have a thickness of from, for example, about 0.1 to about 50 microns, and where the metal gridlines formed on the buffer layer(s) may have a thickness of from, for example, about 1 to about 150 microns.

To complete the metallization, the structure is subjected to a thermal treatment, such as co-firing. Co-firing may occur in a belt furnace so that the thermal treatment is conducted inline. The structure may be thermally processed by firing at a temperature from, for example, about 200° C. to about 1,000° C., such as from about 400° C. to about 900° C. or from about 500° C. to about 800° C., thereby deriving a metallized structure.

In embodiments, the inline metalization method can also be used to make an electrode structure for back surface contact solar cells. That is, the inline metallization method may be applied to a backside of the semiconductor substrate to make backside electrodes for the semiconductor substrate if one or more p regions and/or one or more n regions are made on the backside of the semiconductor substrate.

The multiple-layer electrode structure formed by the methods herein may reduce contact resistance and contact area between the semiconductor substrate and the current carrying metal gridlines, and may form the electrode structure with higher height vs. width aspect ratios. As a result, an increase in the absolute efficiency of a silicon photovoltaic cell including the multiple-layer electrode structure of, for example, about 1% compared to current photovoltaic cells may be realized, which may result in a relative improvement for the silicon photovoltaic cell of, for example, about 7%.

The multiple-layer electrode structure and the semiconductor substrate may have a contact area that may be reduced by a factor of about 50 to about 400 when compared to the contact area of conventional silicon solar cells. The decreased contact area may decrease recombination between the semiconductor substrate and the conductive contact layer and/or the metal gridlines. The multiple-layer electrode structure may include use of a lightly doped emitter layer and as a result, the blue response and light absorption can be improved. All these improvements may lead to increased efficiency. Further, a specific contact resistance between the multiple-layer electrode structure and the semiconductor substrate may be from smaller than about $10^{-1}$ ohm·cm$^2$ to about $10^{-8}$ ohm·cm$^2$, from smaller than about $10^{-2}$ ohm·cm$^2$ to about $10^{-8}$ ohm·cm$^2$ or from smaller than $10^{-4}$ ohm·cm$^2$ to about $10^{-8}$ ohm·cm$^2$. All these improvements may lead to increased efficiency.

The multiple-layer electrode structures and the inline methods for forming the multiple-layer electrode structures disclosed herein may be used to form other multiple-layer electrode structures or metal patterns besides photovoltaic or solar cells. For example, the methods may also be used to form metallized structures on any electric or electronic devices where low contact resistance and high current carrying electrodes are required. The methods disclosed herein may also be used to form any functional structures or devices that include a second layer functional material that may be deposited on a portion of the underlying first functional layer material. The methods disclosed herein can be used to directly form a metal pattern on any substrate for any device through depositing an electroless solution in an image-wise manner, by use of a printer, such as an inkjet printer, especially in a situation where the substrate does not have selectivity for the electroless plating deposition.

In a first embodiment, the method includes the use of an inkjet printer to deposit the electroless plating solution directly into the contact areas. In a second embodiment, the method includes the use of a glass frit in the material used for forming the metal gridline, wherein the glass frit is substantially free of to completely free of lead. A further embodiment uses a laser to ablate the nitride layer, to form the contact openings. In another embodiment, a laser is used to activate additional surface area of the passivation layer around one or more of the contact openings, thereby enabling the contact metal to be deposited not only in the contact openings, but also around the contact openings. In another embodiment, a seed layer is first deposited on the passivation layer, which seed layer is activated when the contact openings are formed with a laser, and the activated seed layer allowing the selective plating of the contact metal to occur. Alternatively, a photographic emulsion layer may be used as the seed layer, which can be developed via exposure to light. In a fourth embodiment, patterns of self-assembled monolayers are printed onto the contact openings after formation, acting as seed layers for the plating of the contact metal.

Figure 1:
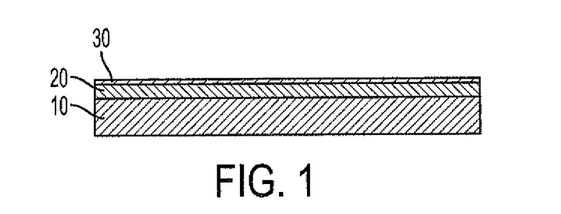
FIGS. 1-4 illustrate a method for forming a multiple-layer electrode structure using inline electroless plating to deposit a contact metal and forming on the contact metal a metal gridline formed from a metal containing material and a glass frit that is substantially free to completely free of lead.

The general methods described herein, including the first embodiment above, will be described with reference to FIGS. 1-4. FIG. 1 shows a semiconductor substrate 10 including an n+ emitter layer 20. On the n+ emitter surface of the semiconductor substrate is a passivation layer 30, such as a silicon nitride layer.

Figure 2:
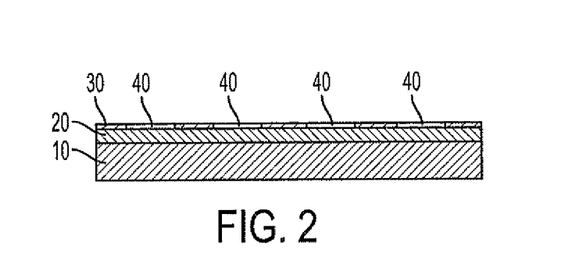

FIG. 2 illustrates contact openings 40 formed in the passivation layer, for example with a laser device as described above.

Figure 3:
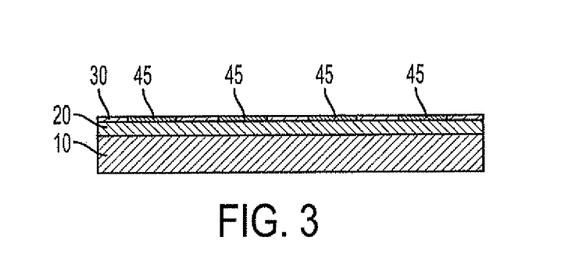

FIG. 3 illustrates a contact metal 45 filled into the contact openings 40 by electroless plating, such as the inline electroless plating method disclosed herein. In this embodiment, as described above, the plating metal is deposited only in the contact openings and not on any of the remaining unaltered surface of the passivation layer.

Figure 4:
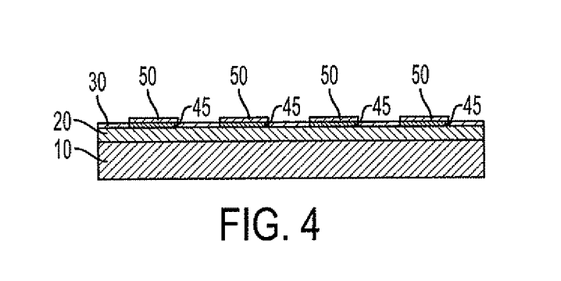

FIG. 4 illustrates a metal gridline 50 formed over each of the metal contact openings containing the plated contact metal. As described above, the metal gridline 50 may be formed by any suitable technique, such as co-extrusion or screen printing.

In the embodiments, in contrast to a conventional electroless plating method that must submerge the article into a bath of electroless plating solution, an inkjet printer is used to selectively deposit electroless plating solution directly into the contact openings. This method reduces the time to manufacture the photovoltaic cell articles because the articles do not need to be removed from the manufacturing line to be placed into the electroless plating solution bath. Instead, the articles stay inline during the manufacturing process, reducing manufacturing time and cost.

In embodiments, in contrast to a conventional screen printing that must use a very aggressive lead containing glass frit in a silver paste used to form the metal gridline, the material for forming the metal gridline is substantially free of to completely free of lead. In the silver paste for conventional screen printing, the glass frit usually contains about 15 to 75 mol % lead and/or PbO, as described in U.S. Patent Application Publication No. 2006/0102228 A1. For the glass frit used in the silver paste for the first embodiment herein, the lead or PbO can be substantially to completely omitted from the metal containing material for forming the gridlines. That is, the content of lead or PbO may be less than 10 mol %, such as less than 5 mol %, and the glass frit can even contain no lead or PbO at all. In the conventional screen printing process, the glass frit is used as an etching agent that dissolves the passivation layer during firing of the structure, allowing the silver to penetrate through the passivation layer to form the required silicon-silver contact. Lead (or lead oxide PbO) is required because it can dissolve a passivation layer such as a silicon nitride. However, this process is not only somewhat unreliable, the use of lead is not desirable, as it poses some environmental concern. In this embodiment, lead can be substantially to completely omitted from the metal containing material for forming the gridlines as the contact openings are previously formed by laser ablation. The metal gridline material thus may include, along with the conductive metal for the gridline, a mild glass frit that is substantially to completely free of lead, which glass frit is used to promote the adhesion of the metal line to the surface of the structure it is in contact with and to serve as a flux to aid the solid state sintering reaction between the metal particles of the metal gridline.

In embodiments, the mild glass frit may be any suitable material, such as $B_2O_3$ or $SiO_2$, with or without additional materials such as $Bi_2O_3$, $In_2O_3$, $SnO_2$, $V_2O_5$, or ZnO. The metal containing material may include a paste containing a silver or silver alloy along with the glass frit, the material being substantially free to completely free of lead. Typically, the silver paste may comprise from about 80 to 99 wt % of silver, from about 1 to 20 wt % of glass frit, and from 1 to about 25 wt % of organic vehicle.

When sputtered nickel is used as the contact metal and a screen printed silver paste is used for the metal gridlines, and the structure is co-fired at 500° C., an electrode is formed which has about two orders of magnitude smaller contact resistivity than a conventionally screen printed electrode, for example with a specific contact resistance of about 0.01 mΩ·cm$^2$ compared to 1 to 3 mΩ·cm$^2$ using the conventional screen printed silver electrode. As electroless plated nickel may have the same quality as sputtered nickel, it is possible to achieve very low contact resistivity with electroless plated nickel.

Figure 5:
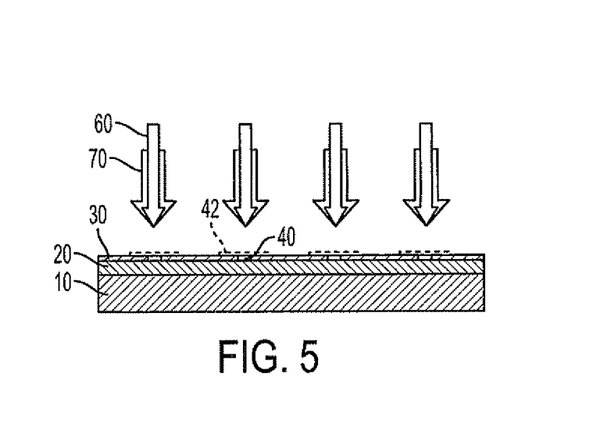
FIGS. 5-7 illustrate a method for forming a multiple-layer electrode structure using laser writing to form contact openings, using inline electroless plating to deposit a contact metal in and around the contact openings, and forming on the contact metal a metal gridline.

The method of the second embodiment, described herein, will be described with reference to FIGS. 5-7.

In a second embodiment, the method includes the use of two laser beams in the formation of the contact openings. The first energy beam is the energy beam to actually cut the contact openings, and is thus the energy beam as described above. For example, the first energy beam is a well-focused, high-energy density narrow beam, or example about 20 microns wide, which forms the contact hole openings in the passivation layer. The second laser beam is a wider beam, for example about 40 to about 150 microns wide, with a lower energy density than the first energy beam. The second energy beam is used to activate the surface of the passivation layer, but does not destroy the passivation layer. Generally, the fluence for the first laser beam is about 5 to 10 J/cm$^2$ and the fluence for the second laser beam is about 1 to 3 J/cm$^2$ or less. The first and second beams are aligned, typically with the first laser beam in the middle of the second laser beam. In this manner, the region of the passivation layer contacted by the first laser beam is ablated to form the contact openings, and the region surrounding the contact openings contacted by the second beam is altered but not removed, permitting that region to received plated metals.

The portions of the passivation layer contacted by the second beam are thus light activated. This light, or laser, activation is believed to enable metal to be subsequently plated on the activated regions of the dielectric passivation layer as a result of the exposure causing local variation of the electronic structure and leading to the appearance of non-zero density of electrostatic states in the vicinity of the electrochemical potential or autocatalytic metal reduction, which promotes the metal deposition by inline electroless plating.

In the method of the second embodiment, a semiconductor substrate structure as illustrated in FIG. 1 may be used to start. FIG. 5 illustrates application of first laser beam 60 and second laser beam 70 to the passivation layer 30, the first laser beam forming contact openings 40 in the passivation layer, and the second laser beam forming activated surface portions 42 around the contact openings 40.

Figure 6:
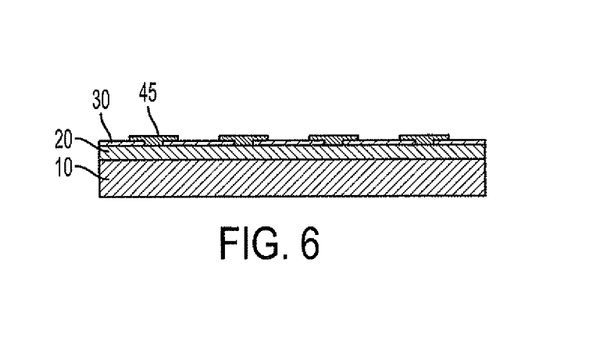
Figure 7:
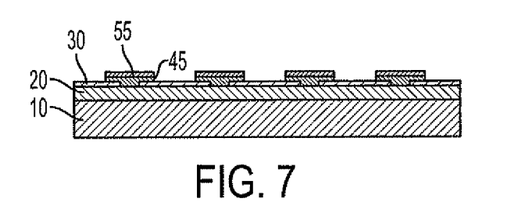

FIG. 6 illustrates a contact metal 45 filled into the contact openings 40 and onto the activated portions 42 by electroless plating, such as inline electroless plating. In this embodiment, the plating metal is deposited by printing electroless plating solution not only in the contact openings, but also around the contact openings. Using this thin contact metal layer as a seed layer, a thicker layer of a more conductive metal, such as silver, copper, or tin may be deposited using a plating technique such as electroplating or electroless plating to form the metal gridlines. Optionally, more than one metal layer, such as a copper layer followed by a tin or silver layer, may also be deposited in order to improve both the conductivity and the solderability of the gridlines. On the other hand, if it is needed, a buffer layer, such as a thin tungsten or chromium layer, may also be deposited prior to depositing the thicker, more conductive metal layer or layers. Deposition of a thick metal layer 55 on the plated contact metal layer 45 is shown in FIG. 7. The process of this embodiment thus may eliminate the need to use screen printing or co-extrusion to form metal gridlines. It is also possible to make the electrode structure with greater height:width aspect ratios, such as an aspect ratio of larger than 1:2, compared to an aspect ratio of about 1:10 with conventional screen printing methods. Finally, these metal layers will be fired at such as 200 to 1000° C. to enhance the adhesion and density.

A third embodiment is shown in FIGS. 8-12. This embodiment is similar to the second embodiment, but instead of using a second laser to activate the surface of the passivation layer, a photosensitive organometallic seed layer is coated onto the passivation layer and used as a seed layer for the plating of the contact metal.

Figure 8:
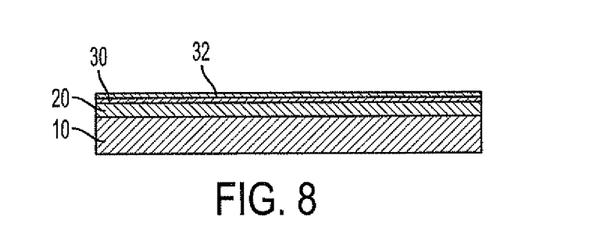
FIGS. 8-12 illustrate a method for forming a multiple-layer electrode structure using a photosensitive organometallic seed layer, laser writing to form contact openings and decompose the seed layer, inline electroless plating to deposit a contact metal and forming on the contact metal a metal gridline.

FIG. 8 shows a semiconductor substrate 10 including an n+ emitter layer or portion 20. On the n+ emitter surface of the semiconductor substrate is a passivation layer 30, such as a silicon nitride layer. Further, on the passivation layer is the photosensitive organometallic seed layer 32. The seed layer 32 is desirably deposited over the entire surface of the passivation layer by any suitable technique which can be completed inline, such as spray coating. The seed layer 32 may have a thickness of from, for example, about 0.1 microns to about 10 microns.

As the photosensitive organometallic seed layer, any suitable material may be used. Examples of the seed layer include, for example, organometallic compounds including one or more of platinum, palladium, copper, rhodium, tungsten, iridium, silver, gold and tantalum. Specific examples of organometallic compounds include palladium acetylacetonate ($Pd(acac)_2$), palladium sulfide ($PdSO_4$), palladium acetate ($PdAc_2$). These organometallic compounds may be dissolved in a suitable solvent such chloroform ($CHCl_3$) or acetic acid (HAc), which may then be coated on the substrate by any suitable technique such as spin coating or spray coating.

Figure 9:
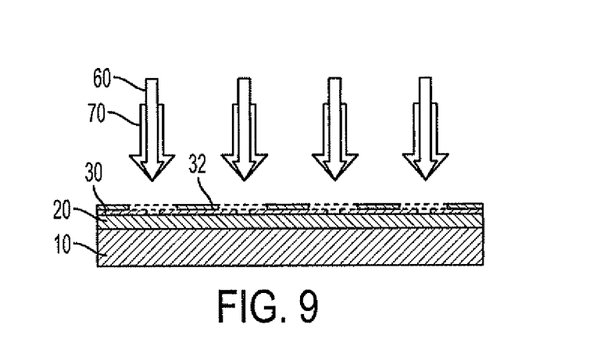
Figure 10:
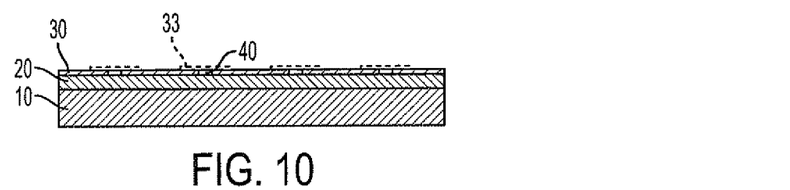

FIG. 9 illustrates exposure of the seed layer to a first laser beam 60 and a second laser beam 70 as in the second embodiment discussed above. The light activation of the seed layer by the second laser beam decomposes the seed layer to form a thin metal layer 33 on the surface of the passivation layer as shown in FIG. 10. The thickness of the formed seed layer may be from, for example, about 0.1 microns to 10 microns. Other metals may then be deposited on the seed layer by an inline electroless plating technique. The unexposed, and thus undecomposed, portions of the seed layer 32 may be easily washed away using a suitable solvent such as deionized water.

Figure 11:
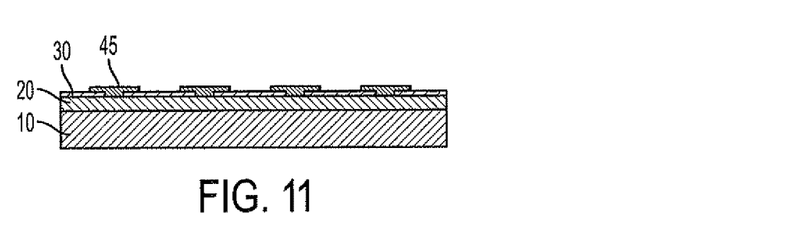
Figure 12:
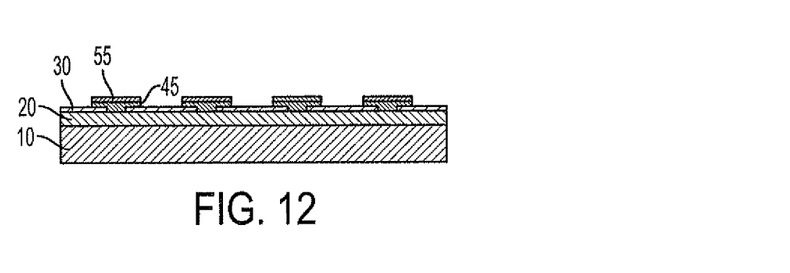

FIG. 11 illustrates a contact metal 45 filled into the contact openings 40 and onto the seed layer portions 33 by plating, such as inline electroless plating. In this embodiment, the plating metal is deposited by printing electroless plating solution not only in the contact openings, but also around the contact openings at the locations of the seed layer 33. Using this thin contact metal layer as a seed layer, a thicker layer of a more conductive metal, such as silver, copper, or tin may be deposited using a plating technique such as electroplating or electroless plating to form the metal gridlines. Optionally, more than one metal layer, such as a copper layer followed by a tin or silver layer, may also be deposited in order to improve both the conductivity and the solderability of the gridlines. On the other hand, if it is needed, a buffer layer, such as a thin tungsten or chromium layer may also be deposited prior to depositing the thicker, more conductive metal layer or layers. Deposition of a thick metal layer 55 on the plated contact metal layer 45 is shown in Fig.

An alternative third embodiment is illustrated in FIGS. 13-18. This alternative is similar to the third embodiment in using a seed layer, but replaces the organometallic catalyst seed layer of the third embodiment, which typically is an expensive material, with a photographic emulsion seed layer.

Figure 13:
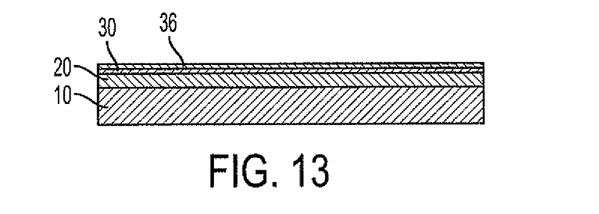
FIGS. 13-18 illustrate a method for forming a multiple-layer electrode structure using a photographic emulsion layer, laser writing to form contact openings, light exposure to develop the photographic emulsion layer, inline electroless plating to deposit a contact metal and forming on the contact metal a metal gridline.

FIG. 13 shows a semiconductor substrate 10 including an n+ emitter layer or portion 20. On the n+ emitter surface of the semiconductor substrate is a passivation layer 30, such as a silicon nitride layer. Further, on the passivation layer is the photographic emulsion seed layer 36. The seed layer 36 is desirably deposited over the entire surface of the passivation layer by any suitable technique which can be completed inline, such as spray coating. The seed layer 36 may have a thickness of from, for example, about 0.1 microns to about 10 microns.

As the photographic emulsion material, any suitable material may be used. Generally, a photographic emulsion comprises one or more kinds of silver halides (chloride, bromide, iodide) crystals suspended in gelatin. Gelatin is a group of compounds with very complex molecular structures largely made of carbon, hydrogen, oxygen and nitrogen atoms having a composition of approximately 70, 7, 25, and 18 parts of these atoms, respectively. The gelatin acts as the protective colloid in that it prevents the silver halide crystals from coalescing, and also controls the size and distribution of the crystals to some extent.

Figure 14:
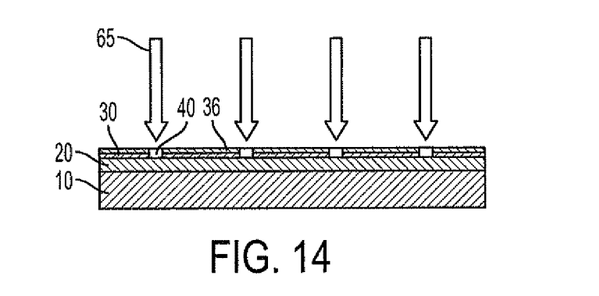

FIG. 14 illustrates exposure of the photographic seed layer and the passivation layer to a laser beam 65 as in the first embodiment above in order to form the contact openings 40 therein.

Figure 15:
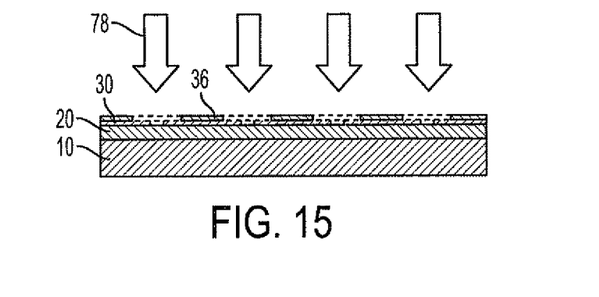
Figure 16:
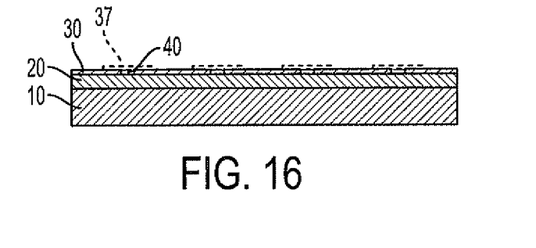

Then, as shown in FIG. 15, the photographic seed layer 36 is exposed to light 75 in order to develop the seed layer. In this way, using standard photographic film development techniques, a metal gridline image may be formed with seed layer portions 37 exposed to the light and remaining on the passivation layer surface following development as shown in FIG. 16. These developed seed layer portions 37 are thus used as the seed layer for subsequent deposition of the plating metal.

Figure 17:
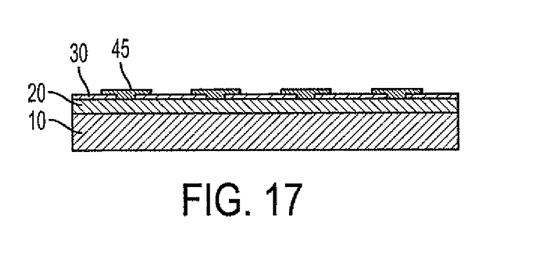
Figure 18:
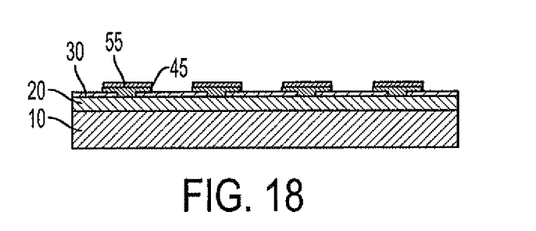

FIG. 17 illustrates a contact metal 45 filled into the contact openings 40 and onto the seed layer portions 37 by inline electroless plating. In this embodiment, the plating metal is deposited by inline printing of electroless plating solution not only in the contact openings, but also around the contact openings at the locations of the seed layer 37. Using this thin contact metal layer as a seed layer, a thicker layer of a more conductive metal, such as silver, copper, or tin may be deposited using a plating technique such as electroplating or electroless plating to form the metal gridlines. Optionally, more than one metal layer, such as a copper layer followed by a tin or silver layer, may also be deposited in order to improve both the conductivity and the solderability of the gridlines. On the other hand, if it is needed, a buffer layer, such as a thin tungsten or chromium layer may also be deposited prior to depositing the thicker, more conductive metal layer or layers. Deposition of a thick metal layer 55 on the plated contact metal layer 45 is shown in FIG. 18.

In this embodiment, registration through the process with the laser ablated contact openings may be maintained via an in-line processing tool such as the conveyor system described in application Ser. No. 11/962,987, incorporated herein by reference in its entirety, in which a substrate passes on a conveyor past the laser patterning terminal, and on the same conveyor system, the substrate subsequently passes through the photographic emulsion development system.

Figure 19:
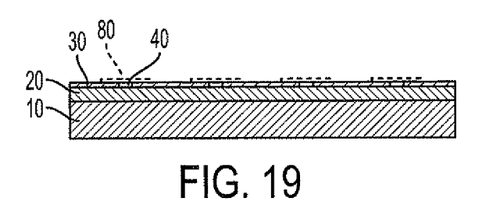
FIGS. 19-21 illustrate a method for forming a multiple-layer electrode structure using laser writing to form contact openings, printing a self-assembled organosilane monolayer over the contact openings, inline electroless plating to deposit a contact metal and forming on the contact metal a metal gridline.
Figure 20:
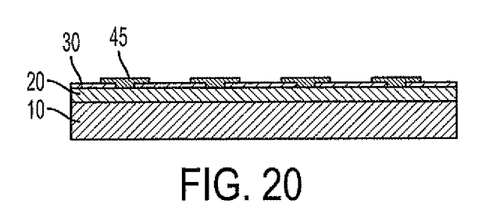
Figure 21:
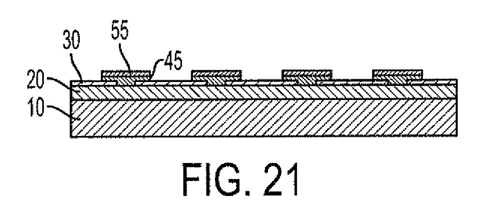

A fourth embodiment is shown in FIGS. 19-21. In this embodiment, self-assembled monolayers are used as seed layers for the deposition of contact metal by plating. Generally speaking, the forming of self-assembled monolayers is a chemical process in which precursor molecules, in a solution or vapor phase, react at interfaces to produce layers of monomolecular thickness, for example on the order of a few nanometers, that are chemically bonded to those surfaces. Rather than having to use a technique such as chemical vapor deposition or molecular beam epitaxy to add molecules to a surface (often with poor control over the thickness of the molecular layer), self-assembled monolayers may be prepared simply by adding a solution of the desired molecule onto the substrate surface and washing off the excess. The chemisorption reactions are thermodynamically driven to completion due to the lower free energy of the molecules when chemically bonded to the surface. Consequently, formation of stable, homogeneous and densely packed molecular layers over large surface areas is energetically favorable.

As the self-assembled monolayers used herein, any suitable material may be used. Examples suitable for use on nitride or oxide such as comprising the passivation layer include self-assembled organosilane monolayers, for example alkyl silanes. Specific example self-assembled monolayer materials include, for example, octadecyltrichlorosilane, PEDA ((aminoethylaminomethyl)phenethyltrimethoxysilane), CMPTS (4-chloromethylphenyltrichlorosilane), MPTS (γ-mercaptopropyltrimethoxysilane), combinations thereof and the like. The self-assembled monolayer material can either contain a ligating group such as an amine or pyridyl donor group or can graft a ligating group after treatment with another chemical such as an acetonitrile solution of lithium ethylenediamine (Li-EDA), which has an affinity for a metal complex catalyst. In this way, the metal catalyst, such as a Pd(II), a Pt(III), a colloid silver and the like, can be absorbed on the surface of the monolayer. The surface of the self-assembled monolayer may thus be used as a seed layer for deposition of the contact metal by plating, such as inline electroless plating.

The self-assembled monolayer materials are deposited on and over the contact openings following formation of the contact openings. The monolayers may be deposited by any suitable technique which can be completed inline, such as jet printing.

The method of this fourth embodiment includes starting with a substrate structure as shown in FIG. 1 above, and subjecting the passivation layer 30 to a laser as described above and illustrated in FIG. 2 to form contact openings in the passivation layer.

FIG. 19 illustrates a subsequent step of jet printing the self-assembled monolayer material 80 on and around the contact openings 40, which is done inline. The monolayer material can be jetted as is, or in a solution with a solvent such as benzene, chloroform, methanol. The concentration of the solution may be, for example, from about 1 to 10 wt %, and the solvent may be evaporated by heating the substrate, for example by using inline radiation heating to heat the substrate to about 60° C. to 100° C. after jetting. Extra solution or monolayer material jetted onto the passivation layer surface may be removed, for example by washing.

The deposited self-assembled monolayer materials may then be subjected to exposure to a metal catalyst material, for example by inline printing a metal catalyst solution containing, for example, Pd(II), Pt(III) or a silver colloid and the like, onto the monolayer surface to form a catalyst metal. The monolayer may then act as a seed layer for plating deposition of the contact metal. Except using self-assembled monolayer materials, it is also possible to jet print a thin layer of an activator solution, such as a palladium-tin hydrosol, as a seed layer for plating deposition of the contact metal.

FIG. 20 illustrates a contact metal 45 filled into the contact openings 40 and onto the seed layer portions 80 by inline electroless plating. In this embodiment, the plating metal is deposited by printing electroless plating solution not only in the contact openings, but also around the contact openings at the locations of the seed layer 80. Using this thin contact metal layer as a seed layer, a thicker layer of a more conductive metal, such as silver, copper, or tin may be deposited using a plating technique such as electroplating or electroless plating to form the metal gridlines. Optionally, more than one metal layer, such as a copper layer followed by a tin or silver layer, may also be deposited in order to improve both the conductivity and the solderability of the gridlines. On the other hand, if it is needed, a buffer layer, such as a thin tungsten or chromium layer, may also be deposited prior to depositing the thicker, more conductive metal layer or layers. Deposition of a thick metal layer 55 on the plated contact metal layer 45 is shown in FIG. 21.

During the subsequent co-firing of the structure, the plated metal, such as Ni, penetrates through the self-assembled monolayer to form a good metal/emitter contact with low contact resistivity.

Figure 22:
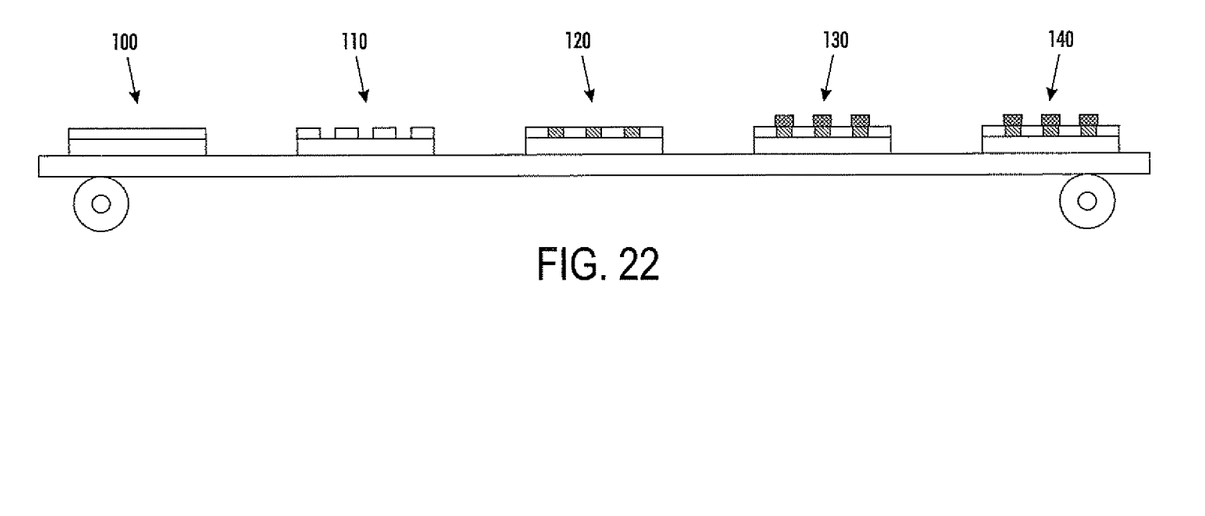
FIG. 22 illustrates a method for the inline metallization of photovoltaic cells.

FIG. 22 illustrates the fully inline metallization process. The beginning of the process 100 starts with a substrate loaded onto a conveyor. Then, in the next step 110, openings are made through the nitride layer on the substrate, by using a method, such as a laser ablation method described above. The substrate then moves to the third step 120, where electroless plating solution is printed into the openings using an ink jet printing device to form a contact metal layer. The plating solution, such as Nickelex, made by Transene Company, can be printed into the contact openings using a printer, such as any suitable inkjet printer, such as piezoelectric inkjet printers made by Xerox, Epson and Dimatix. The substrate is precisely maintained in position on the conveyor when transported from step 110 to step 120 by pre-calibrating and registering the laser ablation apparatus and the printer, therefore the printer can precisely print the electroless plating solution into the contact openings. A heater, such as an IR heater, immediately follows the printing device to heat the printed solution to finish the contact metal plating process. During the fourth step 130, the substrate has Ag gridlines screen printed or extruded onto the contact metal layer. The substrate then moves down the inline process to the fifth step 140 where the metallization process is completed by co-firing the substrate with the contact metal and Ag gridlines, in a belt furnace.

It will be appreciated that various of the above-disclosed and other features and functions, or alternatives thereof, may be desirably combined into many other different systems or applications. Also, it will be appreciated that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

What is claimed is:

1. A method for forming a photovoltaic cell electrode structure, wherein the photovoltaic cell electrode structure comprises a semiconductor substrate having a passivation layer thereon, the method comprising:
    providing a plurality of contact openings through the passivation layer to the semiconductor substrate;
    selectively plating a contact metal into the plurality of contact openings to deposit the contact metal by printing electroless plating solution directly into the plurality of contact openings;
    depositing at least one metal containing layer over the deposited contact metal to form metal gridlines; and
    firing the deposited contact metal and the at least one deposited metal containing layer,
    wherein all of said providing, said selectively plating, said depositing and said firing are performed while said semiconductor substrate remains disposed on a conveyor belt, and
    wherein the method further comprises
    depositing a light sensitive seed layer on the passivation layer prior to forming the plurality of contact openings in the passivation layer, and
    light activating the light sensitive seed layer in portions on and surrounding one or more of the plurality of contact openings, wherein
    the selective plating of the contact metal deposits the contact metal at light activated portions of the light sensitive seed layer and in the plurality of contact openings.

2. The method according to claim 1, wherein the printing is done with an inkjet printer.

3. The method according to claim 1, wherein the plurality of contact openings are formed by laser ablation of the passivation layer.

4. The method according to claim 1, wherein the plurality of contact openings are formed by chemical etching.

5. The method according to claim 1, wherein the contact metal comprises one or more of nickel, cobalt, titanium, tantalum, tungsten, molybdenum, and palladium.

6. The method according to claim 1, wherein the at least one metal containing layer comprises a paste containing a silver or silver alloy.

7. The method according to claim 6, wherein the paste further comprises a glass frit and is at least substantially free of lead or lead oxide.

8. The method according to claim 1, wherein the method further comprises forming a buffer layer over the deposited contact metal prior to depositing the at least one metal containing layer.

9. The method according to claim 1, wherein the depositing the at least one metal containing layer over the deposited contact metal comprises screen printing, extrusion, pad printing, jet printing or dispensing a metal containing paste over the deposited contact metal layer.

10. The method according to claim 1, wherein the depositing the at least one metal containing layer over the deposited contact metal comprises electroless plating, electroplating, or light induced plating one or more metal containing layers over the deposited contact metal layer.

11. The method according to claim 1, wherein the firing is conducted at about 200° C. to about 1000° C.

12. The method according to claim 1, wherein the method further comprises
    light activating portions of a surface of the passivation layer surrounding one or more of the plurality of contact openings, and
    the selective plating of the contact metal into the plurality of contact openings also deposits the contact metal onto the light activated portions of the passivation layer.

13. The method according to claim 12, wherein
    the light activating portions comprises application of a laser to the passivation layer surface, and
    the light activating laser has an energy density to activate the surface but not to destroy the passivation layer.

14. The method according to claim 1, wherein the light sensitive seed layer comprises an organometallic material.

15. The method according to claim 1, wherein the method further comprises
    depositing a self-assembled monolayer material on the passivation layer following forming the plurality of contact openings in the passivation layer at portions on and surrounding one or more of the plurality of contact openings, and
    the selective plating of the contact metal deposits the contact metal on the self-assembled monolayer and in the plurality of contact openings.

16. The method according to claim 1, wherein the process further comprises
    depositing a further metal containing material on the deposited metal containing layer, the further metal containing material having a conductivity greater than a conductivity of the deposited metal containing layer, and
    the firing fires the deposited contact metal, the deposited metal containing material, and the further deposited metal containing layer.

17. The method according to claim 1, wherein the semiconductor substrate comprises a silicon wafer and the passivation layer comprises silicon nitride.

* * * * *